United States Patent [19]

Schink et al.

[11] Patent Number: 4,928,069

[45] Date of Patent: May 22, 1990

[54] AMPLIFYING SURFACE WAVE RECEIVER

[75] Inventors: Helmut Schink; Ralf D. Schnell, both of Munich, Fed. Rep. of Germany

[73] Assignee: Siemens Aktiengesellschaft, Berlin and Munich, Fed. Rep. of Germany

[21] Appl. No.: 245,379

[22] Filed: Sep. 16, 1988

[30] Foreign Application Priority Data

Sep. 29, 1987 [DE] Fed. Rep. of Germany ....... 3732857

[51] Int. Cl.$^5$ ................................. H03F 3/04
[52] U.S. Cl. ....................... 330/5.5; 330/250
[58] Field of Search .................... 330/5, 5.5, 250

[56] References Cited

U.S. PATENT DOCUMENTS

| | | | |
|---|---|---|---|
| 3,388,334 | 6/1968 | Adler | 330/5.5 |
| 3,648,185 | 3/1972 | Acket et al. | 330/5 |
| 3,675,140 | 7/1972 | Fang et al. | 330/5.5 |
| 3,826,932 | 7/1974 | Wang | 330/5.5 X |
| 3,909,741 | 9/1975 | Harris | 330/5.5 |
| 4,025,876 | 5/1977 | Fletcher et al. | 330/5.5 X |

OTHER PUBLICATIONS

Fischler et al., "Amplification of Acoustic Waves in a Coupled Semiconductor-Piezoelectric Ceramic System", *Applied Physics Letters*, vol. 13, No. 10, Nov. 15, 1968, pp. 351-353.
Meyer, "An Acoustoelectric Transistor", *IEEE Transactions on Electron Devices*, vol. ED-18, No. 8, Aug. 1971, pp. 597-603.
Hoskins et al., "Monolithic GaAs Acoustic Charge Transport Devices", IEEE 1982 Ultrasonics Symposium, pp. 456-460.

*Primary Examiner*—James B. Mullins
*Attorney, Agent, or Firm*—Hill, Van Santen, Steadman & Simpson

[57] ABSTRACT

An amplifying surface wave receiver for a surface wave element composed of a material which exhibits the piezo effect and which can be rendered electrically conductive by local doping, where a doped region is formed at the upper portion of an insulating substrate body (8) which forms the surface wave element and which is composed of piezo electric material, said doped region forms a conductive channel (7) between at least two contact electrodes which are spaced a defined distance from each other, and the conductive channel (7) formed such that occurring piezo charges are positioned so as to modulate the conductivity of said channel. One terminal of a voltage source (4) is connected to one of the contact electrodes (6) and the other terminal is connected to the other contact electrode (6) through an alternating current detector (5).

6 Claims, 2 Drawing Sheets

AMPLIFYING SURFACE WAVE RECEIVER

CROSS REFERENCES TO RELATED CASES

This case is related to the application entitled "FREQUENCY-DOUBLING AMPLIFYING SURFACE WAVE RECEIVER" identified in the attorney's records as Case No. P88,1436 in which the inventor is Helmut Schink assigned to the assignee of the present case Ser. No. 245,371, filed Sept. 16, 1988, now U.S. Pat. No. 4,839,607.

BACKGROUND OF THE INVENTION

1. Field of the Invention

The present invention relates to an amplifying surface wave receiver for a surface wave element of a material which has the piezo effect and which can be rendered electrically conductive by local doping.

2. Description of Related Art

In surface wave components, the signals travelling the component are coupled out with transducer structures. Such transducer structures are generally composed of metallic paths which are arranged on an insulating substrate. Due to the piezo effect, the surface wave, couples charges into the body of the surface wave component and these are detected as the signal. The energy content of such signals, however, is relatively low, so that such signal must be re-amplified after being coupled out and must be matched to corresponding, further-processing electronic components.

SUMMARY OF THE INVENTION

It is an object of the present invention to provide an amplifying receiver for surface waves which allow the required amplification of the signal which traverses the surface wave component in a very simple manner.

The object of the present invention is achieved with an amplifying surface wave receiver which uses an alternating current detector.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which

BRIEF DESCRIPTION OF THE DRAWINGS

FIG. 1 shows a piezo electric transducer of the prior art. This known piezo electric transducer is formed of a substrate body 3 of an insulating material which exhibits the piezo effect. Two metallic contact electrodes 2 and 2' are applied to the surface of the substrate body 3 at a defined spaced distance and each of the contact electrodes 2 and 2' are connected to terminals of an alternating voltage detector 1. The operating mode of such an arrangement is known per se, and see, for example, IEEE 1982 Ultrasonics Symposium, pages 456 through 460, Michael J. Hoskins and Bill J. Hunsinger entitled, "Monolithic GaAs Acoustic Charge Transport Devices".

Such a known arrangement has the disadvantage that the amplitude of the signal voltage available at the two contact electrodes is small because of the low energy content of the detected signals, so that the signal must be re-amplified after it has been coupled out and must be matched to corresponding, further-processing devices. Depending on the application, this may lead to difficulties. In any case, however, it results in a relatively high technological expense.

Figure 1:
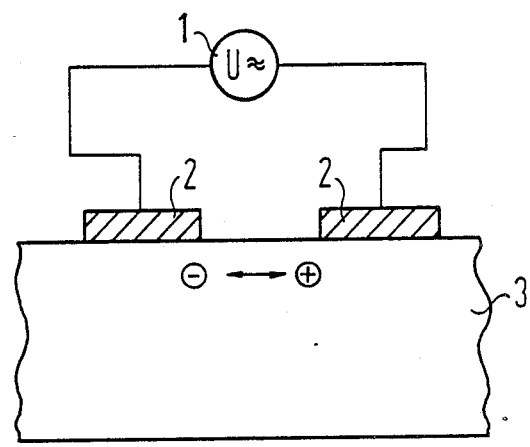
FIG. 1 is a schematic illustration of a piezo electric transducer for surface wave components on an insulating substrate of the prior art.
Figure 2:
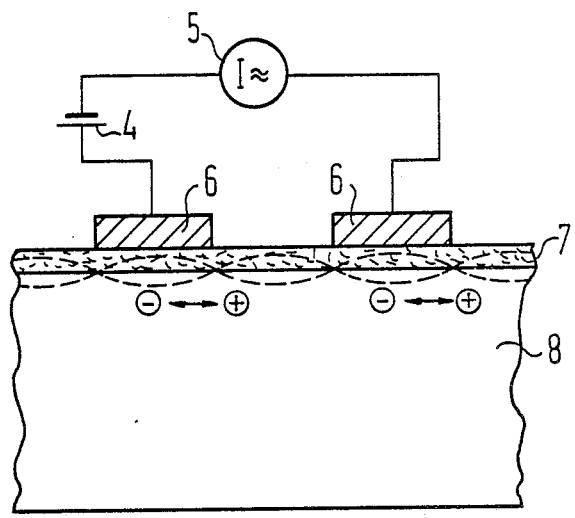
FIG. 2 is a schematic illustration of a preferred exemplary embodiment of a surface wave receiver of the invention.

FIG. 2 is a schematic illustration of a preferred exemplary embodiment of the present invention. An amplifying surface wave receiver for a surface wave element formed of a material which has the piezo effect and which can be rendered electrically conductive by local doping is shown. A doped region is formed in the upper portion of an insulating substrate body 8 which forms the surface wave element which is composed of material which has a piezo-electric effect, such as GaAs. The doped region forms a conductive channel 7 between two contact electrodes 6 and 6' which have a defined distance from each other. The conductive channel 7 is formed such that the occurring piezo charges are in a position so as to modulate the conductivity of the channel 7. The conductive channel 7 forms a conductive layer. One pole terminal of a voltage source 4 is connected to one of the contact electrodes 6 and the other pole terminal of source 4 is connected to the other contact electrode 6' through an alternating current detector 5.

Figure 3:
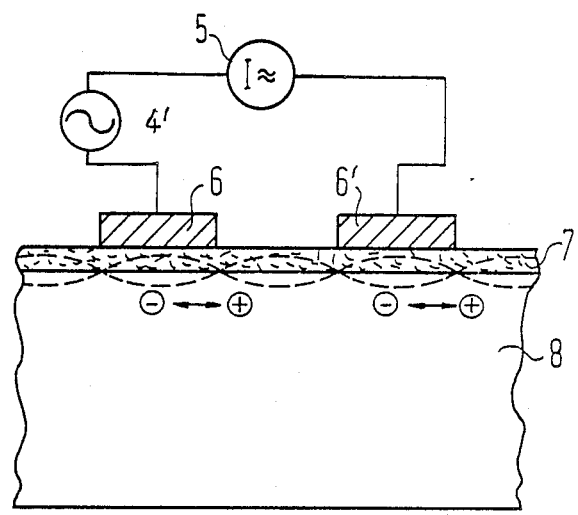
FIG. 3 illustrates a modification of the invention.

The voltage source 4 is preferably a DC voltage source but, alternatively may be an AC voltage source which has a frequency with a prescribed relationship to the frequency of the surface waves. FIG. 3 shows an AC voltage source modification. The contact electrodes 6 and 6' are preferably composed of a metallic material, as for example, aluminum. The alternating current detector 5 can be formed in a variety of ways. Preferably, it is formed as a current-detecting semiconductor arrangement which is applied to the substrate body 8 as an integral component part of the surface wave element.

In the illustration of FIG. 2, the variation of the conductive channel as a consequence of the control effect of the occurring piezo-electric charges is shown schematically in broken lines. As a result of the variation or modulation of the conductive channel, the resistance thereof is changed, so that, depending on the amplitude of the voltage of the voltage source 4, the current in the overall circuit arrangement is a rippled direct current or an alternating current, and the rippled direct current or alternating current can be detected by the alternating current detector 5 in a known manner. The piezo charges have an effect similar to the gate charges in a MESFET or MOSFET. The amplification factor depends both on the geometrical dimensioning as well as on the electrical dimensioning of the device.

The surface wave component of the invention can be realized on all substrate materials that, (1) exhibit the piezo effect and, (2) can be rendered electrically conductive by local doping. A preferable material is, as already mentioned, GaAs.

The present invention is not limited to the illustrated exemplary embodiment. Modifications of the exemplary embodiment can be constructed by a person having ordinary skill in the art without departing from the general idea of the invention or the protective scope as defined by the claims.

We claim as our invention:

1. An amplifying surface wave receiver for a surface wave element composed of a material which has the piezo effect and which can be rendered electrically conductive by local doping, characterized in that a region is formed in the upper portion of an insulating substrate body (8) which forms the surface wave element and which is formed of piezo effect material, said region forms a conductive channel (7) between at least two contact electrodes (6 and 6') which have a defined distance between them, said conductive channel formed such that occurring piezo charges are in positions so as to modulate the conductivity of said channel (7); and a voltage source (4) with one terminal connected to one of said contact electrodes (6) and the other terminal connected to the other of said contact electrodes (6') through an alternating current detector (5).

2. An amplifying surface wave receiver according to claim 1, characterized in that said material is GaAs.

3. An amplifying surface wave receiver according to claim 1 or 2, characterized in that said contact electrodes (6 and 6') are formed of a metallic material.

4. An amplifying surface wave receiver according to claim 1 or 2, characterized in that said voltage source (4) is a direct current voltage source.

5. An amplifying surface wave receiver according to claim 1 or 2, characterized in that said voltage source (4) is an alternating current voltage source which has a frequency which has a predetermined relationship to the frequency of the surface waves.

6. An amplifying surface wave receiver for a surface wave element composed of a material which has the piezo effect and which can be rendered electrically conductive by applying a conductive layer, characterized in that a region is formed in the upper portion of an insulating substrate body (8) which forms the surface wave element and which is formed of piezo effect material, said region forms a conductive channel (7) between at least two contact electrodes (6 and 6') which have a defined distance between them, said conductive channel formed such that occurring piezo charges are in positions so as to modulate the conductivity of said channel (7); and a voltage source (4) witih one terminal connected to one of said contact electrodes (6) and the other terminal connected to the other of said contact electrodes (6') through an alternating current detector (5).

* * * * *